(12) United States Patent
Yasuda et al.

(10) Patent No.: US 7,905,663 B2
(45) Date of Patent: Mar. 15, 2011

(54) ELECTRONIC APPARATUS AND PHOTOELECTRIC CONVERSION MODULE

(75) Inventors: Hiroki Yasuda, Mito (JP); Koki Hirano, Hitachinaka (JP); Juhyun Yu, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 80 days.

(21) Appl. No.: 12/490,535

(22) Filed: Jun. 24, 2009

(65) Prior Publication Data

US 2009/0324171 A1 Dec. 31, 2009

(30) Foreign Application Priority Data

Jun. 25, 2008 (JP) ................................ 2008-165530

(51) Int. Cl.
*G02B 6/36* (2006.01)
(52) U.S. Cl. .......................................... 385/88; 385/53
(58) Field of Classification Search ........................ None
See application file for complete search history.

(56) References Cited

U.S. PATENT DOCUMENTS

| 5,615,292 | A  | * | 3/1997  | Beckwith ........................ 385/89   |
| 6,222,665 | B1 | * | 4/2001  | Neuner et al. .................. 359/245   |
| 6,227,720 | B1 | * | 5/2001  | Isaksson ........................ 385/75    |
| 6,299,362 | B1 | * | 10/2001 | Gilliland et al. ................ 385/92   |
| 6,840,685 | B1 | * | 1/2005  | Kuba ............................. 385/88   |

FOREIGN PATENT DOCUMENTS

| JP | 2003-149512 | 5/2003 |
| JP | 2006-245025 | 9/2006 |

* cited by examiner

*Primary Examiner* — Sung H Pak
(74) *Attorney, Agent, or Firm* — Antonelli, Terry, Stout & Kraus, LLP.

(57) ABSTRACT

There is provided an electronic apparatus connectable to a receptacle of an external electric device. The electronic apparatus includes: a substrate; an electronic component mounted on the substrate; an electric connector which is provided on one longitudinal end of the substrate, electrically connected with the electronic component, and is insertable into the receptacle of the external electric device; first and second spacers respectively provided on the opposite surfaces of the substrate; a metal case for covering the substrate, the electronic component, the electric connector, and the first and second spacers; and a resin protective cover for covering the metal case. The metal case is provided in such a manner that an electrical connection portion thereof required for electrical connection with the receptacle is left exposed. The metal case is in contact with and supported by the first and second spacers.

7 Claims, 2 Drawing Sheets

FRONT SIDE ←     BACK SIDE →

ELECTRONIC APPARATUS AND PHOTOELECTRIC CONVERSION MODULE

CLAIM OF PRIORITY

The present application claims priority from Japanese patent application serial no. 2008-165530 filed on Jun. 25, 2008, the content of which is hereby incorporated by reference into this application.

BACKGROUND OF THE INVENTION

1. Field of the Invention

The present invention relates to electronic apparatuses for connection with an external electric device, and particularly to photoelectric conversion modules for connecting an opto-electric hybrid cable (containing an optical fiber and an electric wire) to an external electric device.

2. Description of Related Art

In order to handle growing amount of information resulting from the rapid proliferation of the Internet and multimedia applications, optical interconnection technologies are being developed for use in optical signal transmission between various processing devices. In conventional photoelectric conversion modules, for example, an array of optical elements is disposed at the front end of a connector and is connected with an optical fiber, and the optical elements convert optical signal from the fiber into electrical signal (e.g., JP-A-2003-149512). In most electronic devices, a demand exists for reduced size and improved heat dissipation capability. For example, JP-A-2006-245025 discloses a structure for dissipating heat generated from components in an electronic device casing, in which the heat generating components are thermally coupled with a heat dissipation plate (having integrated thereon circuit components), and the heat dissipation plate is exposed to the exterior of the casing.

In addition to such optical interconnection, electrical connections (low-speed signal, power supply, grounding, etc.) are also required. For this purpose, opto-electric hybrid cables containing both an electric wire and an optical fiber are often used.

FIG. 3 is a schematic illustration showing a plan view of a conventional photoelectric conversion module for connecting an opto-electric hybrid cable to an external electric device. As shown in FIG. 3, in the conventional photoelectric conversion module 31, an electrical wiring circuit and an optical element 33 are provided on the surface of a glass epoxy substrate 32. An optical fiber 34 of an opto-electric hybrid cable 38 is disposed to face the optical element 33, while an electric wire 35 of the opto-electric cable 38 is connected to an input terminal Pi of the electrical wiring circuit. Further, a connector 37 is electrically connected to output terminals Po of the substrate 32 via cables 36.

The optical element 33 (or the optical element 33 and a controller IC for controlling the optical element 33) converts optical signal from the optical fiber 34 to electrical signal, which is then outputted to the connector 37 via the cable 36 connected to the output terminal Po. Likewise, electrical signal is inputted from the electric wire 35 to the input terminal Pi, and is outputted to the connector 37 via the cable 36 connected to the output terminal Po. By connecting the connector 37 of the photoelectric conversion module 31 to an external electrical device, the opto-electric hybrid cable 38 can be connected to the external electrical device. Although, for simple explanation, FIG. 3 illustrates a photoelectric conversion module containing only one optical fiber 34 and only one electric wire 35, a photoelectric conversion module containing multiple optical fibers 34 and multiple electric wires 35 can be similarly configured.

Typically, in the photoelectric conversion module 31, the glass epoxy substrate 32 and the connector 37 are integrated, and in order to form a protective cover for the optical fiber 34 and the optical element 33, a resin is molded over a region extending from a back side portion of the connector 37 to a front end portion of the opto-electric hybrid cable 38.

A problem with such a conventional photoelectric conversion module 31 is that the resin used for molding the protective cover may cause faults such as breakage of the cable 36 due to stresses exerted thereon and as bending of the terminals of the connector 37. Another problem is that such a protective resin cover provided over the entire photoelectric conversion module 31 may inhibit efficient dissipation of heat generated from components such as optical elements and ICs.

SUMMARY OF THE INVENTION

Under these circumstances, in order to address the above problems, it is an objective of the present invention to provide a photoelectric conversion module integrated with an electric connector which does not suffer from faults caused by a resin used for molding a protective cover and also can efficiently dissipate heat generated from electronic components such as optical elements and ICs.

(1) According to one aspect of the present invention, there is provided an electronic apparatus connectable to a receptacle of an external electric device, which includes: a substrate; an electronic component mounted on the substrate; an electric connector provided on one longitudinal end of the substrate and electrically connected with the electronic component, the connector being insertable into the receptacle of the external electric device so as to be electrically connected to the external electric device, the connector having an electrical connection portion required for electrical connection with the receptacle; an first spacer provided on a first surface of the substrate; a second spacer provided on a second surface of the substrate opposite to the first surface of the substrate; a metal case that covers the substrate, the electronic component, the electric connector, and the first and second spacers in such a manner that the electrical connection portion of the connector is left exposed, the case being in contact with and supported by the first and second spacers; and a protective cover of a resin, the cover covering the metal case in such a manner that a longitudinal end portion of the metal case on the side of the receptacle is left exposed.

In the above aspect (1) of the present invention, the following modifications and changes can be made.

(i) Electrical wiring is formed on each of the first and second surfaces of the substrate; first and second metal terminals are formed in the electric connector; and the substrate is formed to be less than 2 mm in thickness and insertable between the first and second metal terminals.

(2) According to another aspect of the present invention, there is provided a photoelectric conversion module for connecting an opto-electric hybrid cable containing an optical fiber and an electric wire to a receptacle of an external electric device, which includes: a substrate; a flexible board mounted on a first surface of the substrate via an FPC (flexible printed circuit) connector provided at a first longitudinal end of the flexible board; a support plate which supports a second longitudinal end of the flexible board opposite to the first longitudinal end of the board; an optical path converter formed on a first surface of the flexible board and optically coupled to a core of the optical fiber; an optical element mounted on a second surface of the flexible board opposite to the first surface of the board and optically coupled to the core of the optical fiber via the optical path converter; an electric connector provided on one longitudinal end of the substrate on the side of the receptacle and electrically connected to the optical element, the connector being insertable into the receptacle of the external electric device so as to be electrically connected with the external electric device, the connector having an electrical connection portion required for electrical connection with the receptacle; a first spacer provided on the first surface of the substrate; a second spacer provided on a second surface of the substrate opposite to the first surface of the substrate; a metal case that covers the substrate, the flexible board, the electric connector, and the first and second spacers in such a manner that the electrical connection portion of the connector is left exposed, the case being in contact with and supported by the first and second spacers; and a protective cover of a resin, the cover covering the metal case in such a manner that a longitudinal end portion of the metal case on the side of the receptacle is left exposed.

In the above aspect (2) of the present invention, the following modifications and changes can be made.

(ii) First and second metal terminals are formed in the electric connector; and the substrate is formed to be less than 2 mm in thickness and insertable between the first and second metal terminals.

(iii) The flexible board is supported on the first surface of the substrate by the FPC connector provided at the first longitudinal end of the board and by the support plate provided at the second longitudinal end of the board in such a manner that the second surface of the board faces the first surface of the substrate and the optical element is not in contact with the first surface of the substrate.

(iv) The first spacer includes: a first spacer base which is provided between the substrate and the flexible board and that supports the flexible board; and a first thermally conductive sheet (or adhesive) which is provided above the first spacer base and between the optical path converter and a first wall of the metal case. And, the second spacer includes: a second spacer base which is provided on the second surface of the substrate; and a second thermally conductive sheet (or adhesive) that is provided between the second spacer base and a second wall of the metal case opposite to the first wall of the case.

(3) According to another aspect of the present invention, there is provided a photoelectric conversion module for connecting an opto-electric hybrid cable containing an optical fiber and an electric wire to a receptacle of an external electric device, which includes: a substrate; a flexible board mounted on a first surface of the substrate via an FPC (flexible printed circuit) connector provided at a first longitudinal end of the flexible board; a support plate that supports a second longitudinal end of the flexible board opposite to the first longitudinal end of the board; the optical fiber mounted on a first surface of the flexible board and having an optical path converter formed at one end of the fiber on the side of the external device; an optical element mounted on a second surface of the flexible board opposite to the first surface of the board and optically coupled to a core of the optical fiber via the optical path converter; an electric connector provided on one longitudinal end of the substrate on the side of the receptacle and electrically connected to the optical element, the connector being insertable into the receptacle of the external electric device so as to be electrically connected with the external electric device, the connector having an electrical connection portion required for electrical connection with the receptacle; a first spacer provided on the first surface of the substrate; a second spacer provided on a second surface of the substrate opposite to the first surface of the substrate; a metal case which covers the substrate, the flexible board, the electric connector, and the first and second spacers in such a manner that the electrical connection portion of the connector is left exposed, the case being in contact with and supported by the first and second spacers; and a protective cover of a resin, the cover covering the metal case in such a manner that a longitudinal end portion of the metal case on the side of the receptacle is left exposed.

(Advantages of the Invention)

According to the present invention, a substrate is connectively inserted between upper and lower metal terminals provided inside an electrical connector, and a metal case covers the electrical connector and the substrate, and spacers are provided between the metal case inner wall and the substrate. The use of such a metal case can suppress the occurrence of faults caused by a resin used for molding a protective cover and also can efficiently dissipate heat generated from electronic components such as optical elements and ICs.

In addition, a flexible printed board (having mounted thereon an optical waveguide and an optical element) is connected with an optical fiber and is mounted on the substrate via an FPC connector. Thus, an optical fiber is easily mounted on the substrate. Further, the substrate (having mounted thereon the optical fiber and an electric wire) can be connectively inserted between the upper and lower metal terminals of the electrical connector, and thus a photoelectric conversion module integrated with an electric connector can be readily achieved.

DETAILED DESCRIPTION OF THE PREFERRED EMBODIMENTS

Preferred embodiments of the present invention will be described below with reference to the accompanying drawings. However, the present invention is not limited to the embodiments described herein.

First Embodiment of the Invention

Figure 1:
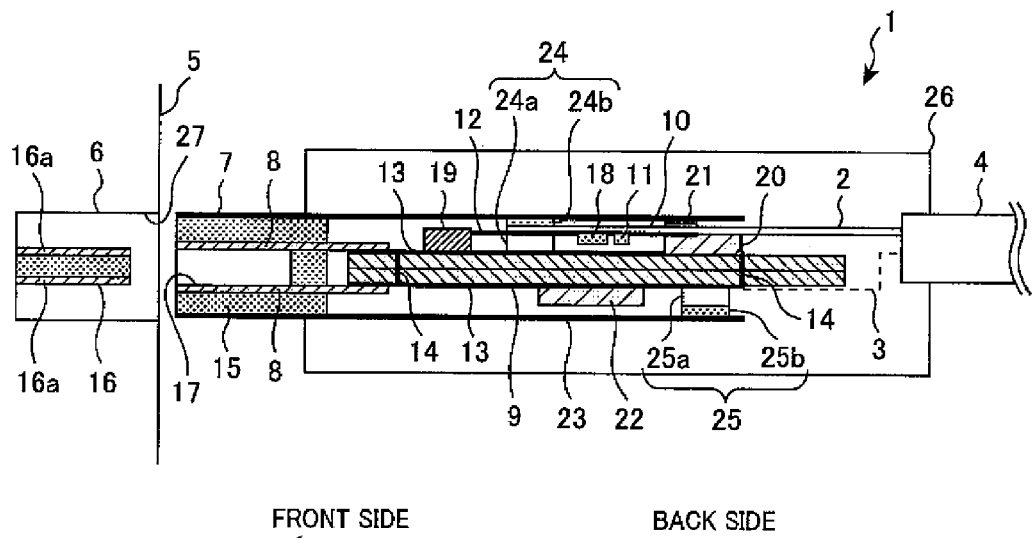
FIG. 1 is a schematic illustration showing a longitudinal sectional view of a photoelectric conversion module according to a first embodiment of the present invention.

FIG. 1 is a schematic illustration showing a longitudinal sectional view of a photoelectric conversion module according to a first embodiment of the present invention. As shown in FIG. 1, a photoelectric conversion module 1 connects an opto-electric hybrid cable 4 (containing an optical fiber 2 and an electric wire 3) to an external electric device 5. Also, the photoelectric conversion module 1 converts electrical signal from the external electric device 5 into optical signal and outputs the optical signal to the optical fiber 2 of the optoelectric hybrid cable 4; and/or conversely the module 1 converts optical signal from the optical fiber 2 into electrical signal and outputs the electrical signal to the external electric device 5.

The photoelectric conversion module 1 according to the present invention essentially includes: an electrical connector 7 for plugging into a receptacle 6 of the external electric device 5; a substrate 9 inserted between upper and lower metal terminals 8 of the electrical connector 7; and a flexible printed board 12 mounting on one surface an optical waveguide 10 (serving as optical path conversion means), and on the opposite surface an optical element 11 optically coupled with the waveguide 10.

The substrate 9 is a rigid substrate made of a glass epoxy or the like and has front electrical wiring 13 and back electrical wiring 13 formed on its front and back surfaces respectively. In this embodiment, the substrate 9 may be formed by bonding, back-to-back, two rigid substrates having the front electrical wiring 13 on its exposed surface. The front electrical wiring 13 on the front surface (on the upper side in FIG. 1) of the substrate 9 is electrically connected with the back electrical wiring 13 on the back surface (on the lower side in FIG. 1) via throughholes 14. The substrate 9 is formed less than 2 mm in thickness. This is because if the substrate 9 is 2 mm or thicker, the following problem arises: When an electrical signal of greater than 1 Gbps is transmitted, there will occur a timing misalignment (i.e., a (clock) skew) between electrical signal on the front surface of the substrate 9 and that on the back surface.

The electrical connector 7 includes: a connector cover 15 insertable into the receptacle 6; and a pair of the upper and lower metal terminals 8 extending toward the receptacle 6 from the back side (the right side in FIG. 1) of the cover 15. At the receptacle-side end of the electrical connector 7 is provided with a reception hole (insertable connection hole) 17 for connectively receiving a projecting pin 16 provided in the receptacle 6. The metal terminals 8 extend outwardly along the inner wall surfaces of the reception hole 17 so that their distal ends are coplanar with the open end of the connector cover 15.

An end portion of the substrate 9 is inserted between the upper and lower metal terminals 8 of the connector 7, and the upper and lower metal terminals 8 are electrically connected, respectively, with the front and back electrical wirings 13 of the substrate 9 by soldering or the like. Here, the thickness of the substrate 9 needs to be formed to be insertable between the metal terminals 8. This can be done by adjusting the distance between the metal terminals 8 to be almost the same as the thickness of the substrate 9 (strictly speaking, slightly greater than the thickness of the substrate 9).

In this embodiment, the optical fiber 2 of the opto-electric hybrid cable 4 is connected to the front surface (on the upper side in FIG. 1) of the substrate 9, and the electric wire 3 to the back surface (on the lower side in FIG. 1). The optical fiber 2 is optically connected to the optical waveguide 10 formed on the front surface of the flexible printed board 12, and the board 12 is further mounted on the front surface of the substrate 9 via an FPC connector 19.

Figure 2:
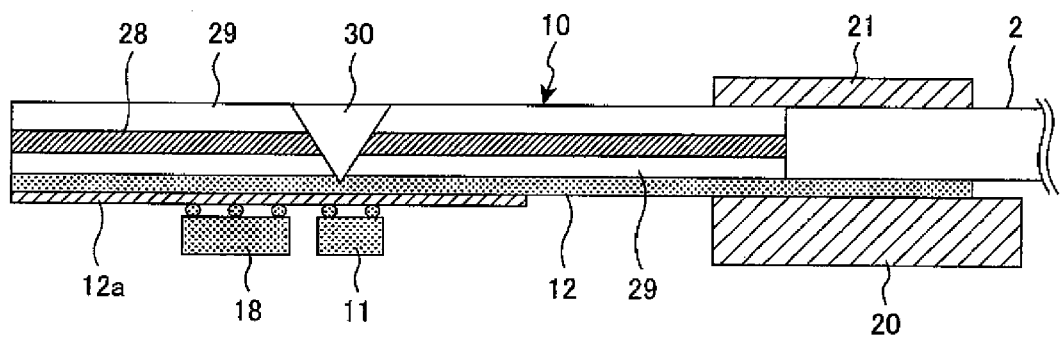
FIG. 2 is a schematic illustration showing an enlarged view of a principal part of FIG. 1.

Next, the flexible printed board 12 is explained in more detail with reference to FIG. 2. FIG. 2 is a schematic illustration showing an enlarged view of a principal part of FIG. 1.

As shown in FIG. 2, the optical waveguide 10 is formed on the front surface (on the upper side in FIG. 2) of the flexible printed board 12, and the optical element 11 and an IC (integrated circuit) 18 for controlling the optical element 11 are mounted on the back surface (on the lower side in FIG. 2). The flexible printed board 12 is made of polyimide or the like. The optical element 11 is a light-receiving element such as a PD (photo diode) or a light-emitting element such as an LD (laser diode). The optical element 11 and IC 18 are each electrically connected to electrical wiring 12a formed on the back surface of the flexible printed board 12.

The optical waveguide 10 includes a core 28 and a clad 29, and has the optical fiber 2 mounted on one end thereof. A mounting groove (not shown) for coupling the core of the fiber 2 and the core 28 of the optical waveguide 10 is provided on the front surface of the flexible printed board 12. In the core 28 of the optical waveguide 10 is formed a mirror 30 for optically coupling the optical waveguide 10 and the optical element 11 mounted on the back surface of the flexible printed board 12. The mirror 30 is provided to be tilted by an angle of 45 degrees with respect to the optical axis of light propagating through the core 28. The mirror 30 reflects light propagating from the optical fiber 2 (through the core 28) toward the optical element 11, and it reflects light from the optical element 11 toward the optical fiber 2 through the core 28.

One end of the flexible printed board 12 is mounted on the substrate 9 via the FPC connector 19 in such a manner that the back surface of the flexible printed board 12 (on which the optical element 11 and IC 18 are mounted) faces the substrate 9. The opposite end of the flexible printed board 12 is supported by a support plate 20 provided on the front surface of the substrate 9. The support plate 20 supports the flexible printed board 12 and therefore the optical waveguide 10 formed on the front surface of the board 12. The flexible printed board 12 is supported by the FPC connector 19 and support plate 20 in such a manner that the optical element 11 is not in contact with the substrate 9 (i.e., a spacing is formed therebetween). A glass cover 21 is provided above the optical fiber 2 connected with the optical waveguide 10. On the back surface of the substrate 9 is provided a voltage transformer IC 22 for transforming the voltage supplied from the external electric device 5 to the voltage at which the optical element 11 operates.

The photoelectric conversion module 1 is provided with a cylinder-like metal case 23 for covering the electrical connector 7 and the substrate 9. The cylinder-like metal case 23 is preferably made of a high thermally conductive material such as copper alloys. Also preferably, the cylinder-like metal case 23 is formed to have about the same width as that of the substrate 9.

A front spacer 24 is provided between the inner wall of the metal case 23 and the front surface of the substrate 9, and a back spacer 25 is provided between the inner wall of the case 23 and the back surface of the substrate 9. The front spacer 24 includes: a front-spacer base 24a, provided between the front surface of the substrate 9 and the flexible printed board 12, for supporting the board 12; and a thermally conductive sheet or adhesive 24b provided above the front-spacer base 24a and between the optical waveguide 10 and the inner wall of the metal case 23. The back spacer 24 includes: a back-spacer base 25a provided on the back surface of the substrate 9; and a thermally conductive sheet or adhesive 25b provided between the base 25a and the inner wall of the metal case 23.

The materials for the bases 24a and 25a are not particularly limited so long as they are highly thermally conductive, but are preferably metal because the bases 24a and 25a made of metal can be soldered on the electrical wiring 13 formed on the substrate 9. The thermally conductive sheet is preferably made, for example, of a thermally conductive silicone rubber. The thermally conductive adhesive is preferably, for example, a thermally conductive epoxy-based adhesive.

The use of metal as the material for the bases 24a and 25a presents the following advantages: (1) Heat can be efficiently dissipated from the substrate 9. (2) The thermally conductive sheets (adhesives) 24b and 25b can have good adhesiveness to the bases 24a and 25a as well as to the metal case 23; therefore good thermal contact between the bases 24a and 25a and the metal case 23 can be achieved. Thus, the spacers 24 and 25 allow heat generated at the substrate 9 to be transferred to the metal case 23.

Here, in FIGS. 1 and 2, the optical waveguide 10, flexible printed board 12, electrical wiring 12a, and the electronic components (such as the optical element 11) are arranged in this order from the side nearer to a wall of the metal case 23. However, there may also be employed a reverse arrangement in which the electronic components, electrical wiring 12a, flexible printed board 12, and the optical waveguide 10 are arranged in this order from the side nearer to a wall of the metal case 23.

The optical fiber 2, optical element 11, and ICs 18 and 22 in the photoelectric conversion module 1 are covered with the cylinder-like metal case 23 for protection. Then, in order to form a protective cover 26, resin is molded over a region extending from a back-side portion of the metal case 23 to a front end portion of the opto-electric hybrid cable 4 in such a way that a front end portion of the case 23 (a portion required for plugging into the receptacle 6 of the external electric device 5) is left exposed. In the front side region of the cover 26, the resin never enters the interior of the metal case 23, because there are no openings through the wall of the metal case 23 around the metal terminals 8 in the front side region.

From the open back end of the metal case 23, the resin is advantageously permitted to enter the interior of the case 23 so long as such entry of the resin does not cause bending or breakage of the metal terminals 8. This is because the thermal conductivities of resins ($0.19\ Wm^{-1}K^{-1}$ for epoxy resins) are greater than that of air ($0.0234\ Wm^{-1}K^{-1}$), so heat generated inside the metal case 23 can be transferred to the case 23 more efficiently.

In FIG. 1, a back side portion of the substrate 9 is not covered by the metal case 23, but the case 23 may be extended so as to cover a front end portion of the opto-electric hybrid cable 4. The metal case 23 according to this embodiment at least covers heat generating electronic components such as ICs in such a way that those electronic components are in thermal contact with the case 23, thus providing heat dissipation effect. Also, the metal case 23 can suppress the occurrence of faults (such as bending and/or breakage) of the metal terminals 8 caused by a molded resin.

The receptacle 6 provided in the external electric device 5 includes: an electrical-connector insertion hole 27 for receiving a front end portion of the connector cover 15; and the projecting pin 16 for inserting into the reception hole 17 of the electrical connector 7. Each of the upper and lower surfaces of the projecting pin 16 is provided with a connection terminal 16a which contacts and electrically connects with the corresponding metal terminal 8 when plugged into the reception hole 17.

Next, the functions and effects of this embodiment will be described. As described before, in the photoelectric conversion module 1, the substrate 9 is connectively inserted between the metal terminals 8, and the cylinder-like metal case 23 covers the electrical connector 7 and substrate 9, and spacers 24 and 25 are provided between the case 23 and the substrate 9.

By sandwiching the substrate 9 between the metal terminals 8 and pressing them together from both sides, the electrical connector 7 and the substrate 9 can be connected with each other more securely and mechanically stably. Further, the metal case 23 (which is supported by the spacers 24 and 25) can suppress the occurrence of faults caused by the resin used for molding the protective cover 26, such as bending of the metal terminals 8 and disconnection caused by removal of the substrate 9 from the metal terminals 8. Thus, the reliability of the photoelectric conversion module 1 can be improved.

Also, the optical fiber 2 is mounted on the flexible printed board 12 having a mounting groove for the optical fiber. The board 12 connected with the optical fiber 2 is further mounted on the substrate 9 via the FPC connector 19. Thus, the optical fiber 2 is easily mounted on the substrate 9.

The optical waveguide 10 is positioned on the flexible printed board 12 so that the optical axis of the waveguide 10 is aligned with that of the optical fiber 2 mounted on the above-mentioned mounting groove. Thus, the optical axes of the optical element 11 and the optical fiber 2 can also be aligned.

The substrate 9 which mounts the optical fiber 2 and the electric wire 3 is inserted between the metal terminals 8 of the electrical connector 7. Thus, the connector 7 and the metal terminals 8 can be easily connected. That is, the photoelectric conversion module 1 integrated with the electrical connector 7 can be readily obtained.

Figure 3:
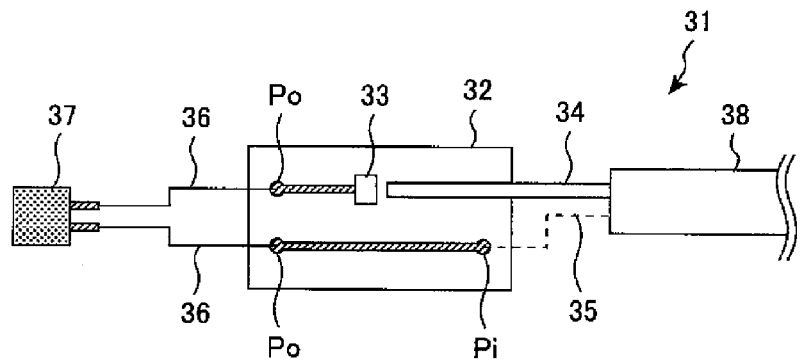
FIG. 3 is a schematic illustration showing a plan view of a conventional photoelectric conversion module for connecting an opto-electric hybrid cable to an external electric device.

The optical fiber 2 is mounted on one surface of the substrate 9, while the electric wire 3 is mounted on the opposite surface, thereby providing a three-dimensional mounting structure. Thus, downsizing can be achieved compared to conventional photoelectric conversion modules employing a two-dimensional mounting structure in which an optical fiber and electric wiring are both mounted on one surface of a substrate (e.g., see FIG. 3).

Also, the spacers 24 and 25 provided on the substrate 9, respectively, have the bases 24a and 25a made of a high thermally conductive material. And, the bases 24a and 25a are connected to the metal case 23 via the thermally conductive sheets or adhesives 24b and 25b, respectively. Thus, heat generated from the optical element 11, IC 18 and voltage transformer IC 22 can be transferred through the spacers 24 and 25 to the metal case 23, and the heat transferred to the case 23 can further be dissipated from the front (exposed) end of the case 23. Thus, efficient heat dissipation can be achieved. In addition, the flexible printed board 12 is supported also by the front-spacer base 24a of the front spacer 24, thus enabling more stable support of the flexible board 12.

In the foregoing embodiment, the back spacer 25 is configured with the back-spacer base 25a and the thermally conductive sheet or adhesive 25b. Alternatively, a thermally conductive sheet or adhesive may be directly applied to the voltage transformer IC 22 mounted on the back surface of the substrate 9 in such a manner the sheet (adhesive) makes contact with the metal case 23.

Second Embodiment of the Invention

Figure 4:
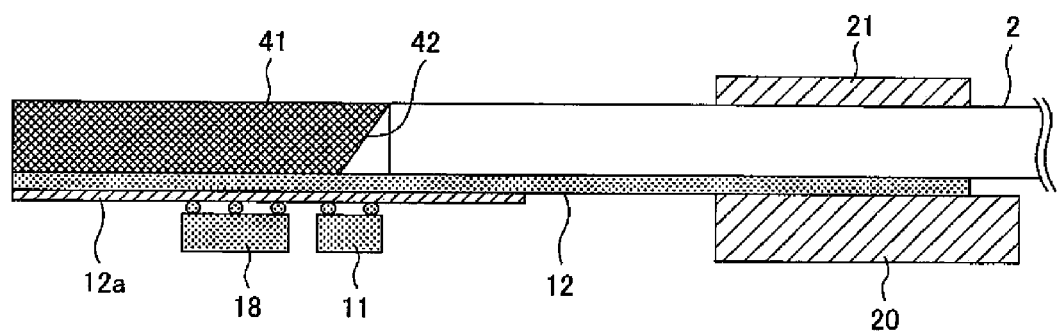
FIG. 4 is a schematic illustration showing an enlarged longitudinal sectional view of a principal part of a photoelectric conversion module according to a second embodiment of the present invention.

The foregoing embodiment has been described using the optical waveguide 10 (and the mirror 30) as an example of the optical path conversion means. FIG. 4 is a schematic illustration showing an enlarged longitudinal sectional view of a principal part of a photoelectric conversion module according to a second embodiment of the present invention. As shown in FIG. 4, an optical lens block 41 having a 45-degree surface 42 on the side of the optical fiber 2 may be alternatively used as the optical path conversion means. The optical element 11 and the core of the optical fiber 2 are optically coupled by means of the 45-degree surface 42 formed on the optical lens block 41. Instead of the optical lens block 41, there may be used a metal block having a 45-degree surface (which can fold the optical path by 90 degrees) on the side of the optical fiber 2. This structure can also optically couple the optical element 11 and the core of the optical fiber 2.

Third Embodiment of the Invention

Figure 5:
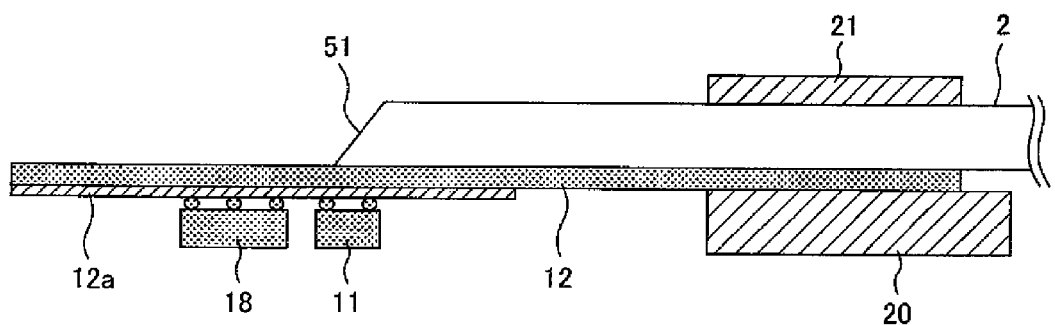
FIG. 5 is a schematic illustration showing an enlarged longitudinal sectional view of a principal part of a photoelectric conversion module according to a third embodiment of the present invention.

FIG. 5 is a schematic illustration showing an enlarged longitudinal sectional view of a principal part of a photoelectric conversion module according to a third embodiment of the present invention. As shown in FIG. 5, an optical path converter 51 may be alternatively formed in the optical fiber 2 by slant-polishing the front end (the end on the side of the external electric device 5) of the optical fiber 2 and vapor depositing a metal material (e.g., Au) on the slant-polished surface. In this structure, the optical path is folded by 90 degrees at the interface between the slant-polished surface and the vapor-deposited metal layer, thus enabling optical coupling between the optical element 11 and the core of the optical fiber 2 by means of the optical path converter 51.

The present invention is not limited to the foregoing embodiments which have been described with reference to a photoelectric conversion module. For example, according to the invention, there can be provided an electronic apparatus integrated with an electric connector in the following manner: One end of a substrate (having mounted thereon electronic components such as ICs) of the electronic apparatus is connectively inserted into the electric connector. Then the substrate and the connector are covered by a metal case, which is further covered by a resin protective cover. Here, the metal case is in contact with and supported by spacers provided on opposite surfaces of the substrate. Also, the metal case is provided in such a manner that the insertable connection hole of the connector (into which a receptacle of an external electric device is inserted) is left uncovered. Further, the resin cover is provided in such a manner that a longitudinal front end portion of the metal case (a portion required for plugging into the receptacle) is left uncovered.

In this manner, there can be fabricated an electronic apparatus integrated with an electric connector which does not suffer from faults caused by a resin used for molding a protective cover and also can efficiently dissipate heat generated from electronic components such as ICs. Additionally, when electrical wirings are provided on both surfaces of a substrate, skew between signals on the both surfaces may occur for electrical signals greater than 1 Gbps. However, such skew can be prevented by making the substrate thinner than 2 mm.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic apparatus connectable to a receptacle of an external electric device, the apparatus comprising:
    a substrate;
    an electronic component mounted on the substrate;
    an electric connector provided on one longitudinal end of the substrate and electrically connected with the electronic component, the connector being insertable into the receptacle of the external electric device so as to be electrically connected to the external electric device, the connector having an electrical connection portion required for electrical connection with the receptacle;
    a first spacer provided on a first surface of the substrate;
    a second spacer provided on a second surface of the substrate opposite to the first surface of the substrate;
    a metal case that covers the substrate, the electronic component, the electric connector, and the first and second spacers in such a manner that the electrical connection portion of the connector is left exposed, the case being in contact with and supported by the first and second spacers; and
    a protective cover of a resin, the cover covering the metal case in such a manner that a longitudinal end portion of the metal case on the side of the receptacle is left exposed.

2. The electronic apparatus according to claim 1, wherein:
    electrical wiring is formed on each of the first and second surfaces of the substrate;
    first and second metal terminals are formed in the electric connector; and
    the substrate is formed to be less than 2 mm in thickness and insertable between the first and second metal terminals.

3. A photoelectric conversion module for connecting an opto-electric hybrid cable containing an optical fiber and an electric wire to a receptacle of an external electric device, the module comprising:
    a substrate;
    a flexible board mounted on a first surface of the substrate via an FPC (flexible printed circuit) connector provided at a first longitudinal end of the flexible board;
    a support plate that supports a second longitudinal end of the flexible board opposite to the first longitudinal end of the board;
    an optical path converter formed on a first surface of the flexible board and optically coupled to a core of the optical fiber;
    an optical element mounted on a second surface of the flexible board opposite to the first surface of the board and optically coupled to the core of the optical fiber via the optical path converter;
    an electric connector provided on one longitudinal end of the substrate on the side of the receptacle and electrically connected to the optical element, the connector being insertable into the receptacle of the external electric device so as to be electrically connected with the external electric device, the connector having an electrical connection portion required for electrical connection with the receptacle;
    a first spacer provided on the first surface of the substrate;
    a second spacer provided on a second surface of the substrate opposite to the first surface of the substrate;
    a metal case that covers the substrate, the flexible board, the electric connector, and the first and second spacers in such a manner that the electrical connection portion of the connector is left exposed, the case being in contact with and supported by the first and second spacers; and
    a protective cover of a resin, the cover covering the metal case in such a manner that a longitudinal end portion of the metal case on the side of the receptacle is left exposed.

4. The photoelectric conversion module according to claim 3, wherein:
    first and second metal terminals are formed in the electric connector; and
    the substrate is formed to be less than 2 mm in thickness and insertable between the first and second metal terminals.

5. The photoelectric conversion module according to claim 3, wherein:

the flexible board is supported on the first surface of the substrate by the FPC connector provided at the first longitudinal end of the board and by the support plate provided at the second longitudinal end of the board in such a manner that the second surface of the board faces the first surface of the substrate and the optical element is not in contact with the first surface of the substrate.

6. The photoelectric conversion module according to claim 5, wherein:

the first spacer includes: a first spacer base which is provided between the substrate and the flexible board and that supports the flexible board; and a first thermally conductive sheet (or adhesive) which is provided above the first spacer base and between the optical path converter and a first wall of the metal case, and wherein:

the second spacer includes: a second spacer base which is provided on the second surface of the substrate; and a second thermally conductive sheet (or adhesive) that is provided between the second spacer base and a second wall of the metal case opposite to the first wall of the case.

7. A photoelectric conversion module for connecting an opto-electric hybrid cable containing an optical fiber and an electric wire to a receptacle of an external electric device, the module comprising:

a substrate;

a flexible board mounted on a first surface of the substrate via an FPC (flexible printed circuit) connector provided at a first longitudinal end of the flexible board;

a support plate that supports a second longitudinal end of the flexible board opposite to the first longitudinal end of the board;

the optical fiber mounted on a first surface of the flexible board and having an optical path converter formed at one end of the fiber on the side of the external electric device;

an optical element mounted on a second surface of the flexible board opposite to the first surface of the board and optically coupled to a core of the optical fiber via the optical path converter;

an electric connector provided on one longitudinal end of the substrate on the side of the receptacle and electrically connected to the optical element, the connector being insertable into the receptacle of the external electric device so as to be electrically connected with the external electric device, the connector having an electrical connection portion required for electrical connection with the receptacle;

a first spacer provided on the first surface of the substrate;

a second spacer provided on a second surface of the substrate opposite to the first surface of the substrate;

a metal case which covers the substrate, the flexible board, the electric connector, and the first and second spacers in such a manner that the electrical connection portion of the connector is left exposed, the case being in contact with and supported by the first and second spacers; and a protective cover of a resin, the cover covering the metal case in such a manner that a longitudinal end portion of the metal case on the side of the receptacle is left exposed.

* * * * *